(12) United States Patent
Lee

(10) Patent No.: US 7,504,866 B2
(45) Date of Patent: Mar. 17, 2009

(54) OUTPUT HOLD CIRCUITS FOR SAMPLE-DATA CIRCUITS

(75) Inventor: Hae-Seung Lee, Bedford, MA (US)

(73) Assignee: Cambridge Analog Technologies, Inc., Bedford, MA (US)

( * ) Notice: Subject to any disclaimer, the term of this patent is extended or adjusted under 35 U.S.C. 154(b) by 19 days.

(21) Appl. No.: 11/617,213

(22) Filed: Dec. 28, 2006

(65) Prior Publication Data

US 2007/0164792 A1     Jul. 19, 2007

Related U.S. Application Data

(60) Provisional application No. 60/754,982, filed on Dec. 29, 2005.

(51) Int. Cl.
   *H03K 5/22*     (2006.01)
(52) U.S. Cl. .............................. 327/78; 327/79; 327/94; 327/337
(58) Field of Classification Search ................... 327/78, 327/79, 94, 337
   See application file for complete search history.

(56) References Cited

U.S. PATENT DOCUMENTS

| | | | | |
|---|---|---|---|---|
| 4,584,532 A | * | 4/1986 | Duehren et al. | 327/554 |
| 4,800,333 A | * | 1/1989 | Milkovic | 324/142 |
| 5,159,341 A | * | 10/1992 | McCartney et al. | 341/143 |
| 5,180,932 A | | 1/1993 | Bengel | |
| 5,600,322 A | | 2/1997 | Garavan | |
| 6,469,561 B2 | * | 10/2002 | Pernigotti et al. | 327/336 |
| 6,573,851 B2 | | 6/2003 | Bult | |
| 6,828,753 B2 | | 12/2004 | Grasso et al. | |
| 6,891,433 B2 | | 5/2005 | Schrader | |
| 7,009,549 B1 | | 3/2006 | Corsi | |

FOREIGN PATENT DOCUMENTS

| | | |
|---|---|---|
| EP | 1221686 A2 | 7/2002 |
| GB | 211841 A | 8/1983 |
| GB | 2247120 A | 2/1992 |
| WO | 2000013006 | 3/2000 |
| WO | 2004043062 | 5/2004 |
| WO | 2006047268 | 5/2006 |

* cited by examiner

*Primary Examiner*—Kenneth B. Wells
(74) *Attorney, Agent, or Firm*—Gauthier & Connors LLP

(57) ABSTRACT

A sampled-data analog circuit uses zero-crossing detector. A waveform generator produces a plurality of segments of ramp at the output. An output of a zero crossing detector controls a sampling switch, thereby causing a precise sample of the output voltage to be taken at the instant the zero crossing detector senses the zero crossing of the input signal. The waveform generator further includes a output hold function to maintain the output voltage.

19 Claims, 17 Drawing Sheets

US 7,504,866 B2

OUTPUT HOLD CIRCUITS FOR SAMPLE-DATA CIRCUITS

PRIORITY INFORMATION

The present application claims priority, under 35 U.S.C. §119(e), from U.S. Provisional Patent Application, Ser. No. 60/754,982, filed on Dec. 29, 2005. The entire content of U.S. Provisional Patent Application, Ser. No. 60/754,982, filed on Dec. 29, 2005, is hereby incorporated by reference.

FIELD OF THE PRESENT INVENTION

The present invention relates generally to output hold circuits for sample-data circuits.

BACKGROUND OF THE PRESENT INVENTION

Most sampled-data analog circuits such as switched-capacitor filters, analog-to-digital converters, and delta-sigma modulators require operational amplifiers to process a signal. Consider the switched-capacitor integrator example shown in FIG. 2. First, the switches $S_{11}$ and $S_{13}$ are closed so that the input voltage $v_{in}$ is sampled on the sampling capacitor $C_{S1}$. Next, the switches $S_{11}$ and $S_{13}$ are opened and $S_{12}$ and $S_{14}$ are closed. This operation transfers the charge in the sampling capacitor $C_{S1}$ to the integrating capacitor $C_{I1}$. The output voltage, $v_{out}$, of a first integrator 1100 is typically sampled by another sampled-data circuit, for example, another switched-capacitor integrator. In the circuit shown in FIG. 2, the circuit consisting of switches $S_{21}$, $S_{22}$, $S_{23}$, $S_{24}$, and a second sampling capacitor $C_{S2}$ comprise a part of the second switched-capacitor integrator. The output voltage, $v_{out}$, of the first integrator 1100 is sampled on the second sampling capacitor $C_{S2}$ by closing switches $S_{21}$ and $S_{23}$.

An example of a timing diagram is shown in FIG. 3. The clock signal has two non-overlapping phases $\phi_1$ and $\phi_2$. The phase $\phi_1$ is applied to switch $S_{11}$, $S_{13}$, $S_{21}$, and $S_{23}$, and phase $\phi_2$ is applied to switches $S_{12}$, $S_{14}$, $S_{22}$, and $S_{24}$. With this timing, the circuit performs non-inverting discrete integration with full clock delay. The waveforms at the output of the integrator, $v_{out}$, and at the virtual ground node 100, $v_1$, are also shown in FIG. 3. Different clock phasing arrangements yield different responses from the integrator. For example, if $\phi_1$ is applied to switches $S_{11}$, $S_{13}$, $S_{22}$, and $S_{24}$, and phase $\phi_1$ is applied to switches $S_{11}$, $S_{14}$, $S_{21}$, and $S_{23}$, the circuit performs non-inverting integration with half-clock delay.

For an accurate integration of the input signal, $v_1$ must be driven as close to ground as possible. In order to accomplish this, the operational amplifier must provide sufficient open-loop gain and low noise. In addition, for fast operation, the operational amplifier 10 of FIG. 2 must settle fast.

In FIG. 3, the voltage $v_1$ is shown to settle back to ground after a disturbance when the sampling capacitor $C_{S1}$ is switched to Node 100 by closing $S_{12}$ and $S_{14}$. In addition to high open-loop gain and fast settling time, operational amplifiers must provide large output swing for high dynamic range. As the technology scales, it becomes increasingly difficult to achieve these characteristics from operational amplifiers. The primary factors that make the operational amplifier design difficult are low power supply voltages and low device gain.

As noted above, accurate output voltage can be obtained if Node 100 in FIG. 2 is maintained precisely at ground. However, in sampled-data circuits, the only point of time that an accurate output voltage is required is at the instant the output voltage is sampled by another sampling circuit. Thus, it is not necessary to maintain the voltage at Node 100 at ground all the time.

Therefore, it is desirable to provide a sampled-data circuit that maintains the proper level at the virtual ground node at the instant the output voltage is sampled by another sampling circuit. Moreover, it is desirable to provide a sampled-data circuit that maintains the proper level at the virtual ground node at the instant the output voltage is sampled by another sampling circuit and provides differential signal paths for sampled-data circuits. Furthermore, it is desirable to provide a sampled-data circuit that reduces the effect of power supply, substrate, and common-mode noise by symmetric differential signal processing. Also, it is desirable to provide a sampled-data circuit that increases the signal range by incorporating differential signal paths.

SUMMARY OF THE PRESENT INVENTION

One aspect of the present invention is a switched-capacitor circuit. The switched-capacitor circuit includes a level-crossing detector to generate a level-crossing detection signal when an input signal crosses a predetermined level; a waveform generator to generate a predetermined waveform; and an amplifier, operatively coupled to the level-crossing detector and the waveform generator. The amplifier holds an output thereof in response to said level crossing detection signal.

Another aspect of the present invention is a method for sampling a signal. The method samples an input voltage using the switched capacitance network; determines when a node voltage of the switched capacitance network crosses a predetermined level; generates a predetermined waveform at an output node; transfers the sampled input voltage to the output node; and holds the transferred sampled input voltage at a constant level at the output node when it is determined that the node voltage of the switched capacitance network crosses the predetermined level.

BRIEF DESCRIPTION OF THE DRAWINGS

The present invention may take form in various components and arrangements of components, and in various steps and arrangements of steps. The drawings are only for purposes of illustrating a preferred embodiment and are not to be construed as limiting the present invention, wherein.

DETAILED DESCRIPTION OF THE PRESENT INVENTION

Figure 1:
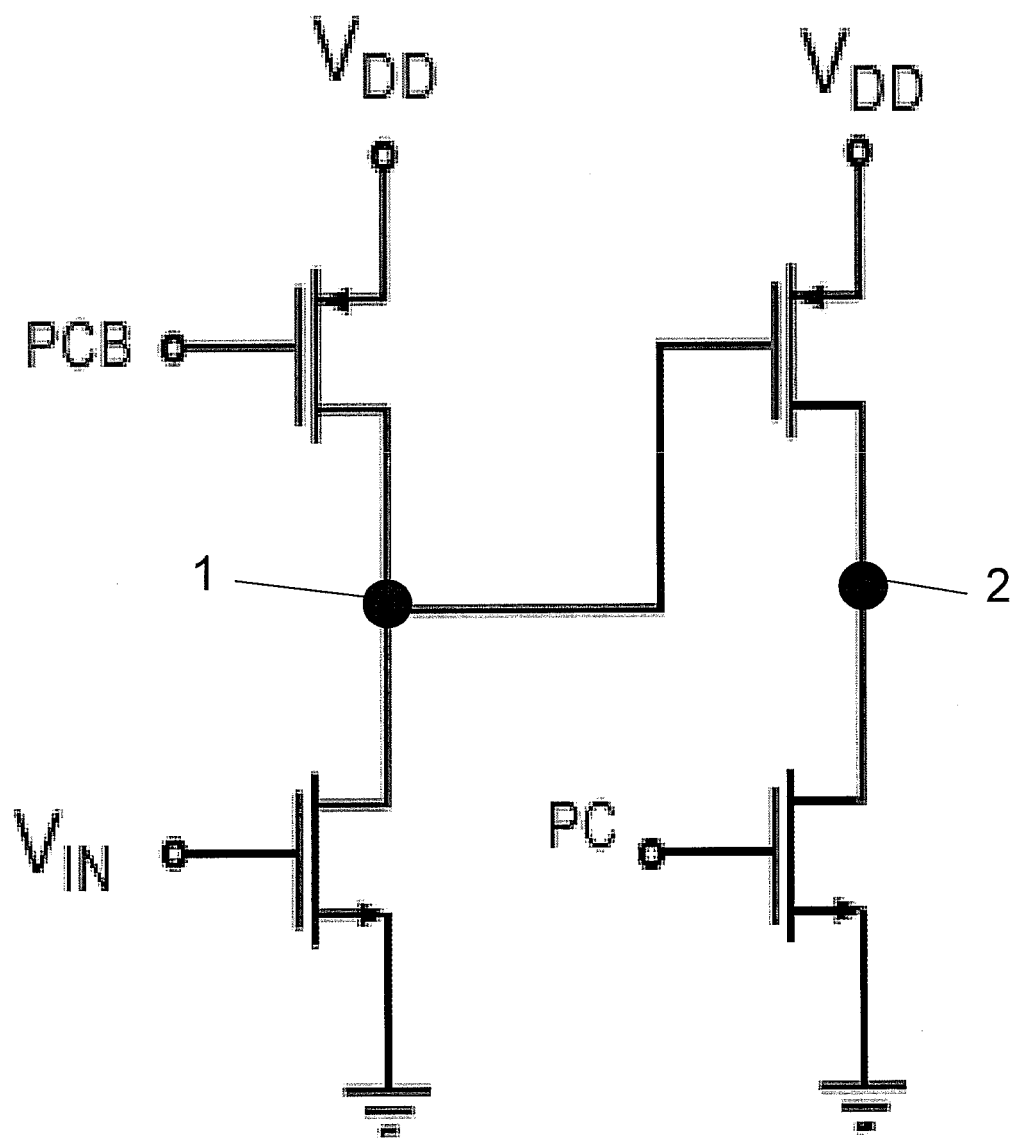
FIG. 1 illustrates a zero-crossing detector.

The present invention will be described in connection with preferred embodiments; however, it will be understood that there is no intent to limit the present invention to the embodiments described herein. On the contrary, the intent is to cover all alternatives, modifications, and equivalents as may be included within the spirit and scope of the present invention, as defined by the appended claims.

For a general understanding of the present invention, reference is made to the drawings. In the drawings, like reference have been used throughout to designate identical or equivalent elements. It is also noted that the various drawings illustrating the present invention may not have been drawn to scale and that certain regions may have been purposely drawn disproportionately so that the features and concepts of the present invention could be properly illustrated.

It is noted that, in the various Figures, the earth symbol indicates the system's common-mode voltage. For example, in a system with 2.5 V and −2.5 V power supplies, the system's common-mode voltage may be at ground. In a system with a single 2.5 power supply, the system's common-mode voltage may be at 1.25 V.

Figure 2:
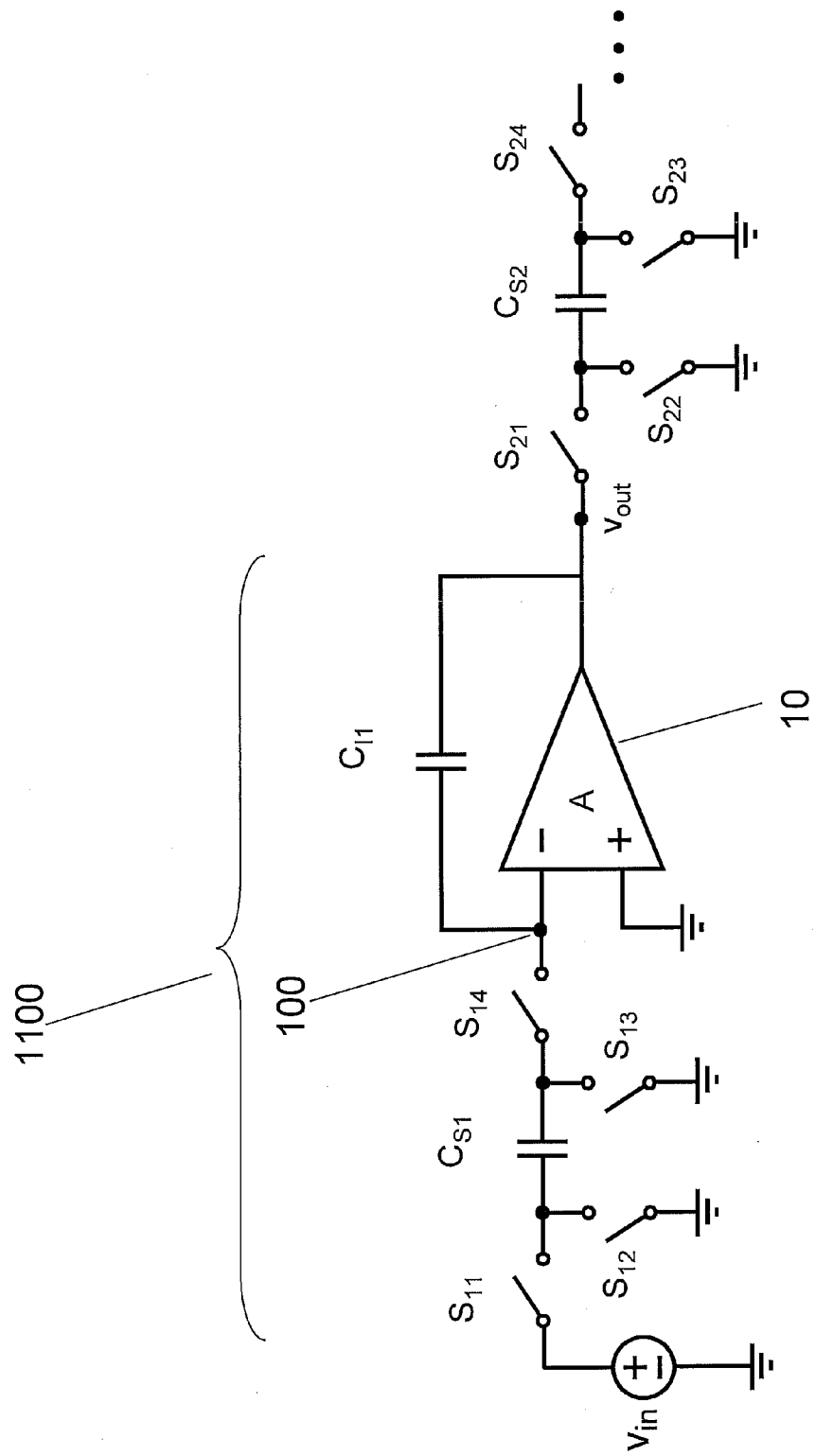
FIG. 2 illustrates a switched-capacitor integrator.
Figure 3:
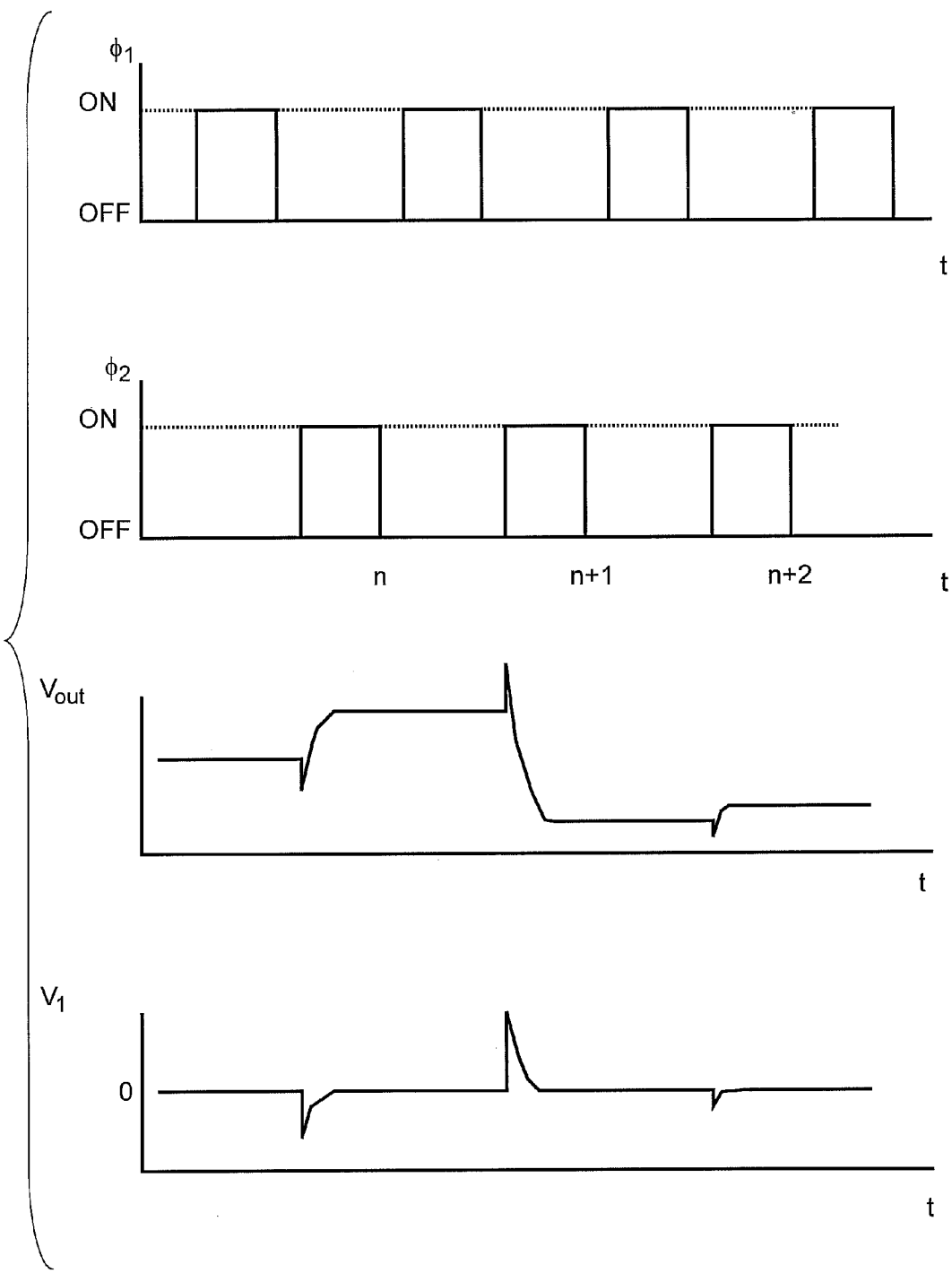
FIG. 3 illustrates a timing diagram for the switched-capacitor integrator of FIG. 2.

As noted above, accurate output voltage can be obtained if Node 100 in FIG. 2 is maintained precisely at ground. However, in sampled-data circuits, the only point of time accurate output voltage is required is at the instant the output voltage is sampled by another sampling circuit. Thus, it is not necessary to maintain the voltage at Node 100 at ground all the time.

Figure 4:
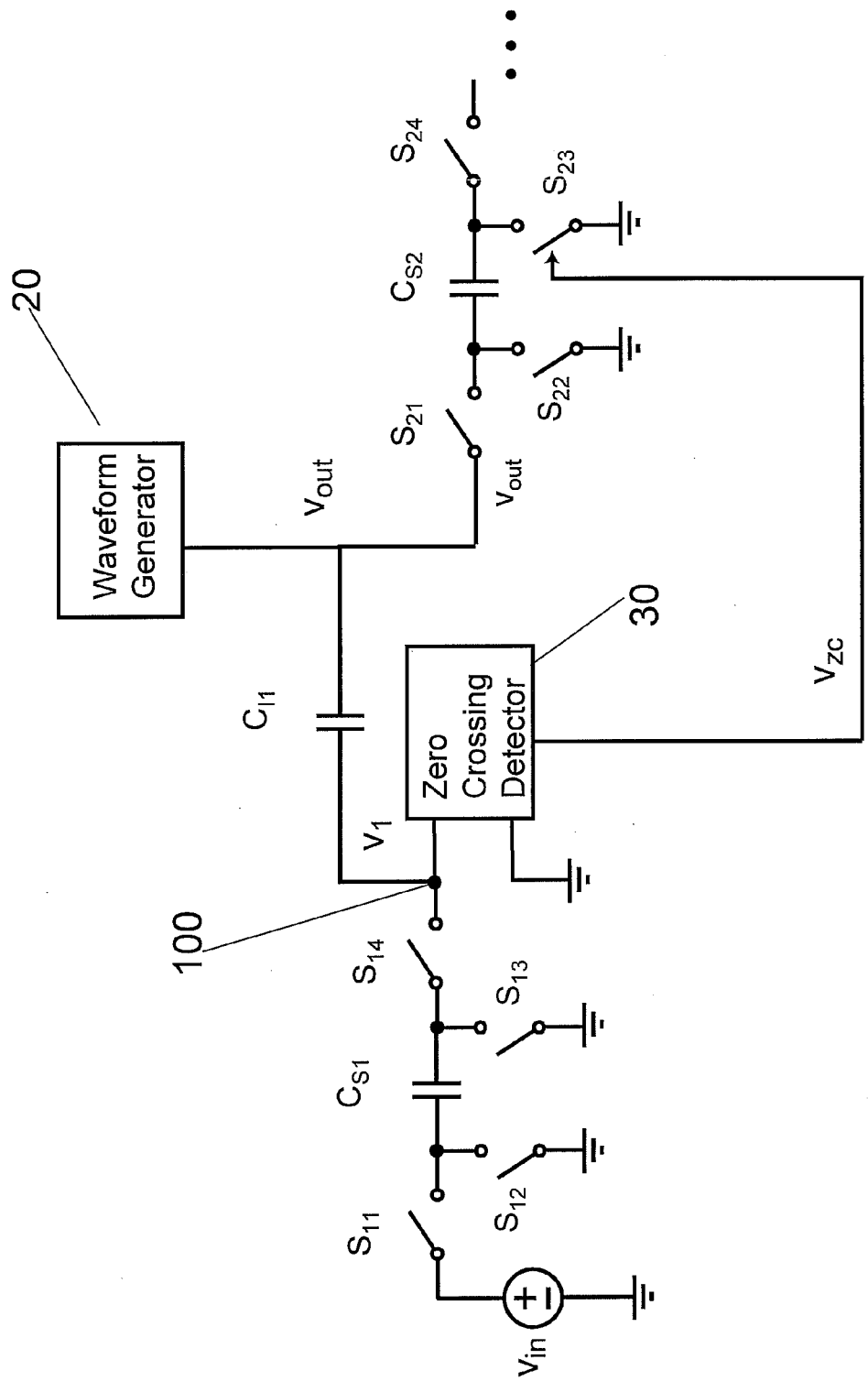
FIG. 4 illustrates a non-inverting integrator according to the concepts of the present invention.

FIG. 4 illustrates a non-inverting integrator according to the concepts of the present invention. More specifically, as an example, a non-inverting integrator with half-clock delay is illustrated in FIG. 4.

As illustrated in FIG. 4, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$. A waveform generator 20 generates a voltage waveform as the output voltage $v_{out}$ in such way the voltage at Node 100 crosses zero if the charge in capacitors $C_{s1}$ and $C_{I1}$ is within a normal operating range.

Figure 5:
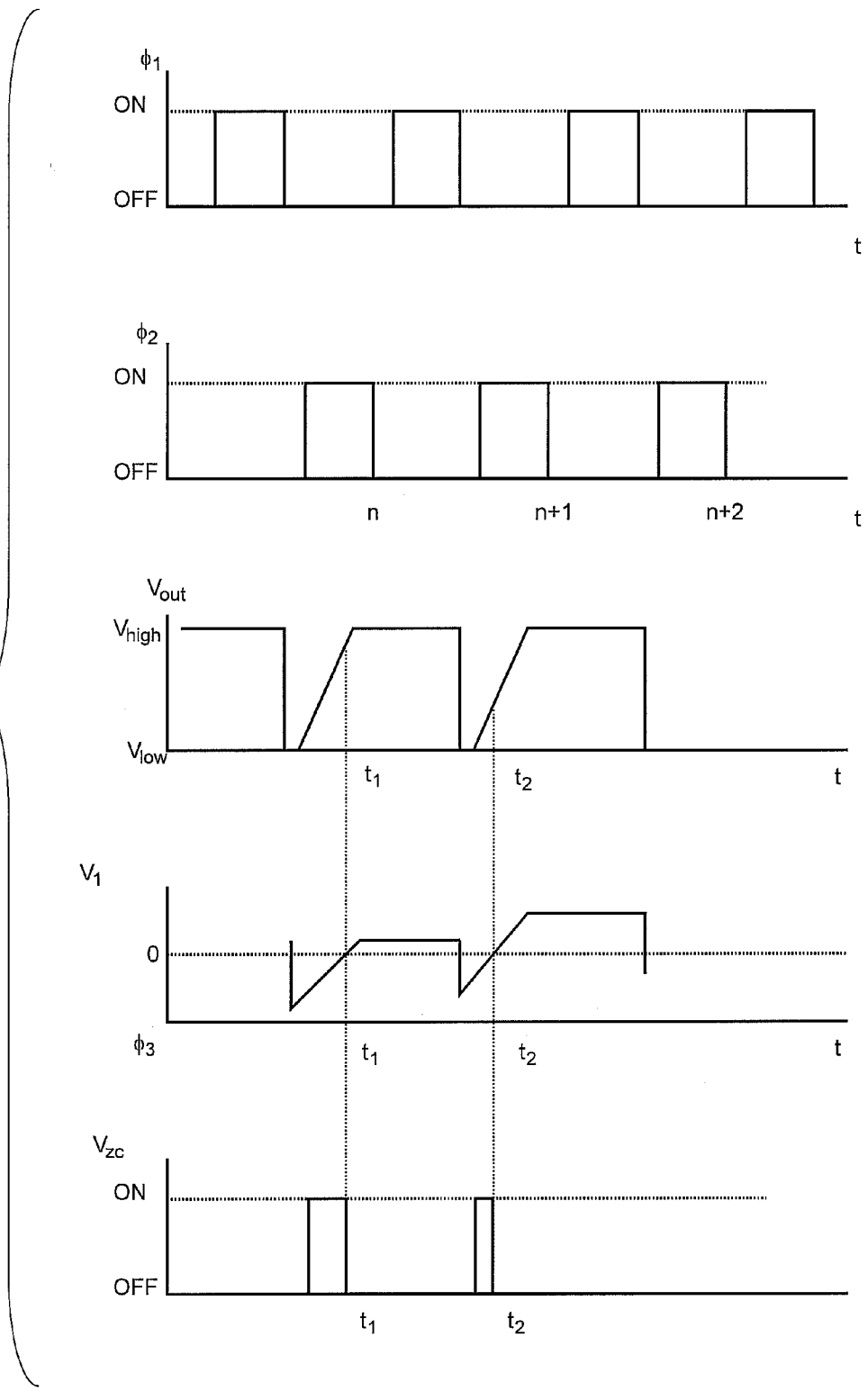
FIG. 5 illustrates a timing diagram for the non-inverting integrator of FIG. 4.

In the timing diagram shown in FIG. 5, the waveform generated by the waveform generator 20 is shown as a ramp. When $v_1$, the voltage at Node 100, crosses zero at time $t_1$, the output $v_{ZC}$ of the zero crossing detector 30 goes low, turning the switch $S_{23}$ OFF. At that instant, the output voltage $v_{out}$ is sampled on $C_{S2}$.

Since $v_1$ is very close to zero when the sample of $v_2$ is taken, an accurate output voltage is sampled on $C_{S2}$. A similar operation repeats during the next clock cycle, and the sample of the output voltage is taken at time $t_2$.

It is noted that the zero crossing detector 30 may optionally have an overflow detection feature that determines when the charge in capacitors $C_{S1}$ and $C_{I1}$ is outside the normal range of operation. It can be implemented by a logic circuit that makes the output $v_{ZC}$ of the zero-crossing detector 30 to go low when $\phi_2$ goes low. In the event $v_1$ fails to cross zero, the sample is taken on the falling edge of $\phi_2$. At the same time, the logic circuit produces a flag indicating overflow.

In the embodiment described above and in the various embodiments described below, a zero crossing detector is utilized in lieu of a comparator. Typically, a comparator is designed to compare two arbitrary input voltages. A comparator may be implemented as cascaded amplifiers, a regenerative latch, or a combination of both. A comparator may be used to detect a zero voltage level or a predetermined voltage level crossing.

It is noted that the input waveform of the various described embodiments is not arbitrary, but deterministic and repetitive. Thus, the various described embodiments determine the instant the zero voltage level or the predetermined voltage level is crossed than relative amplitudes of the input signals. For such a deterministic input, a zero crossing detector is more efficient.

An example of a zero-crossing detector for the detection of a positive-going input signal is shown in FIG. 1. Initially, node 1 and node 2 are precharged to $V_{DD}$ and ground, respectively. The ramp input voltage $V_{IN}$ is applied according to the zero crossing circuit. At the time the input node crosses the threshold, node 1 is discharged rapidly, and node 2 is pulled up to $V_{DD}$.

Since the zero crossing detector in FIG. 1 is a dynamic circuit, there is no DC power consumption, allowing extremely low power and fast operation. For the detection of zero-crossing of a negative-going signal, a complementary circuit with a PMOS input transistor can be utilized.

Figure 6:
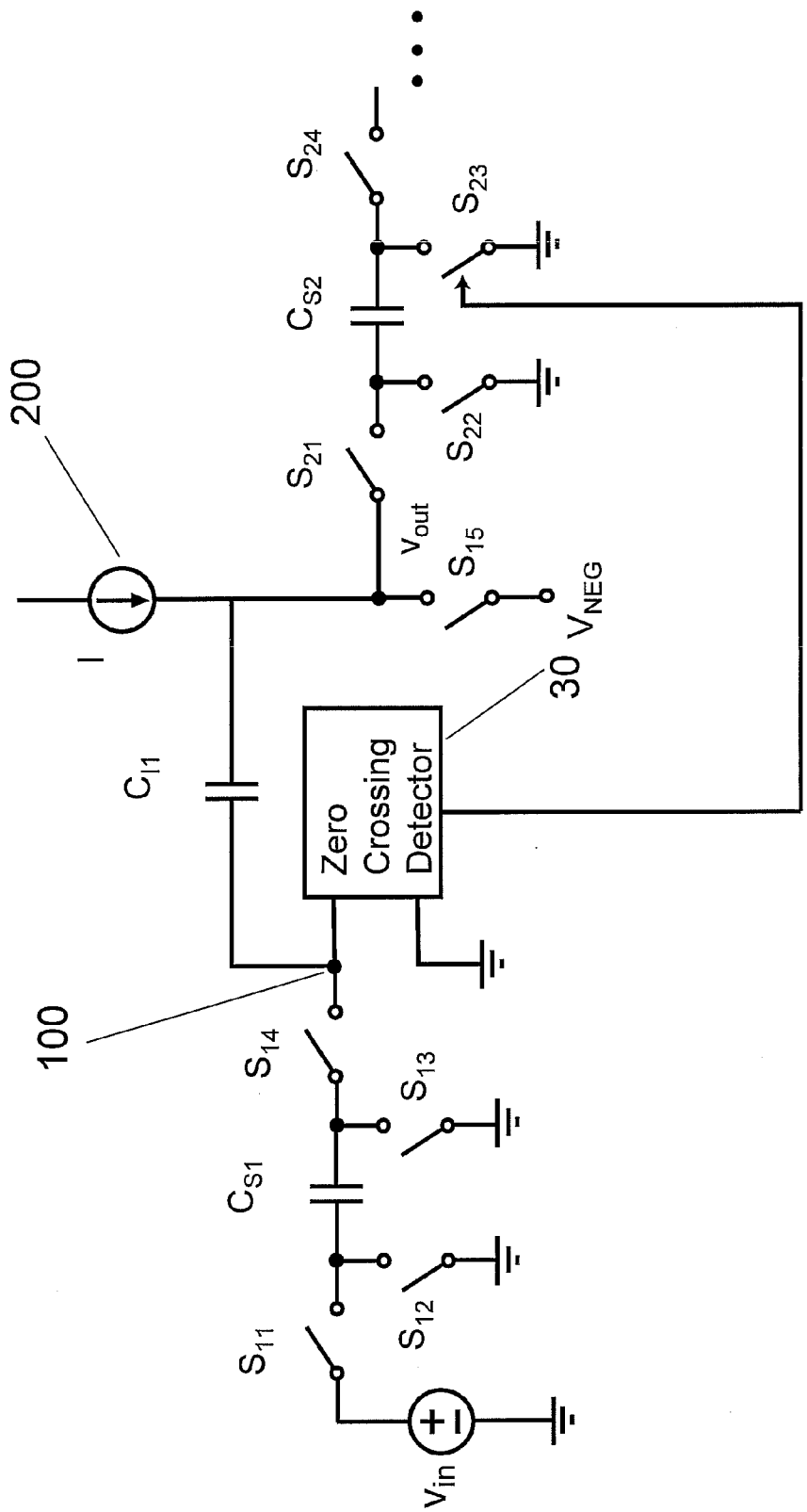
FIG. 6 illustrates a non-inverting integrator with a waveform generator being a current source according to the concepts of the present invention.

As illustrated in FIG. 6, the non-inverting integrator includes a waveform generator which is a current source 200. As illustrated in FIG. 6, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$.

The current source 200 charges the capacitors $C_{S2}$ and the series connected $C_{S1}$ and $C_{I1}$, generating a ramp. At the start of $\phi_2$, the output is briefly shorted to a known voltage $V_{NEG}$, the value of which is chosen to ensure the voltage $v_1$ at Node 100 crosses zero with signals in the normal operating range.

Figure 7:
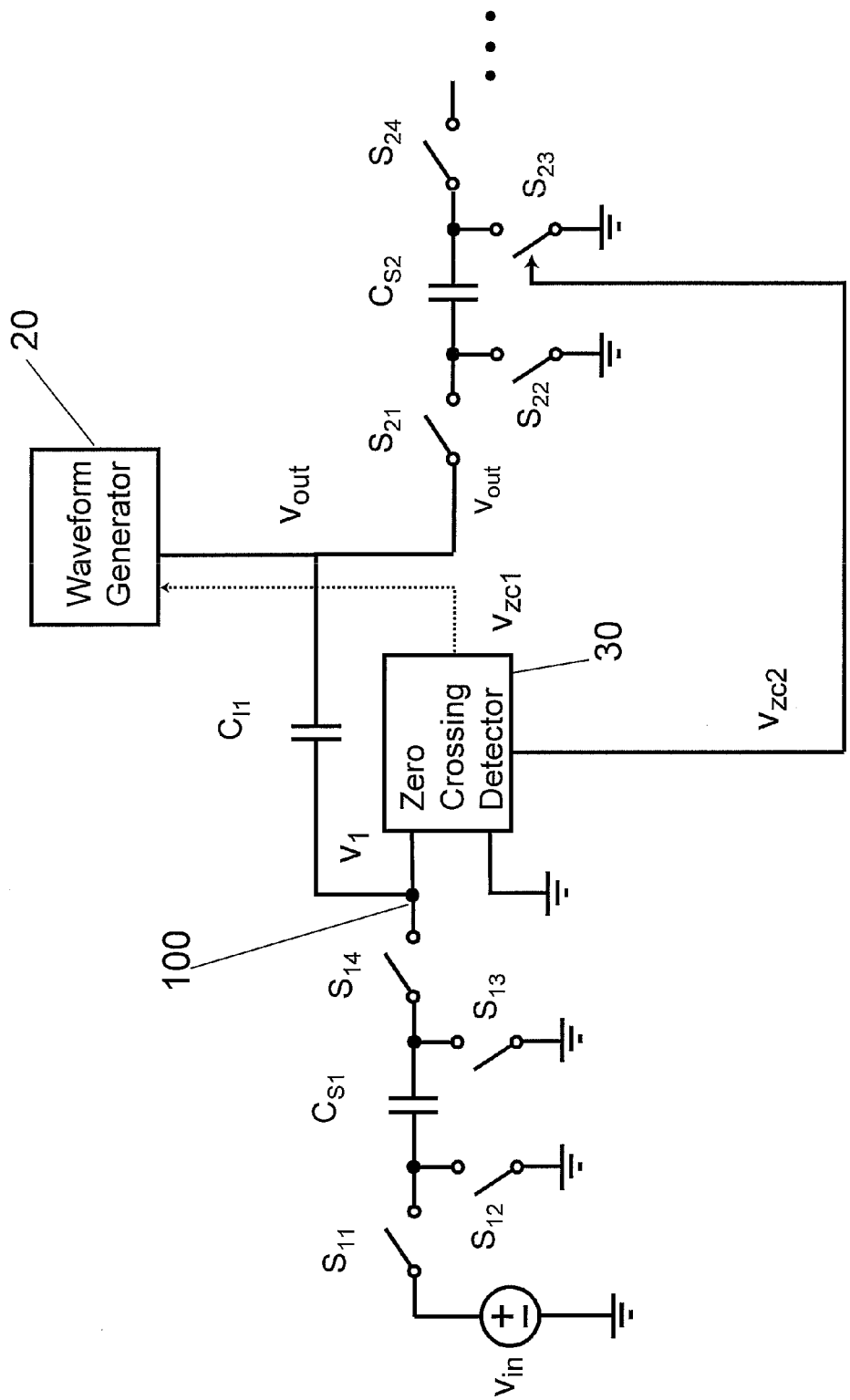
FIG. 7 illustrates another non-inverting integrator according to the concepts of the present invention.

As illustrated in FIG. 7, the non-inverting integrator includes a waveform generator 20 that produces, preferably, a plurality of segments in the waveform with varying rate of change of the output voltage. The first segment may be controlled so as to have the highest rate of change, with subsequent segments having progressively lower rate of change. The detection of zero crossing by the zero crossing detector 30 causes the waveform to advance to the next segment. An output signal $v_{zc2}$ of the zero crossing detector 30 remains high until the zero crossing is detected in the last segment of the waveform.

Figure 8:
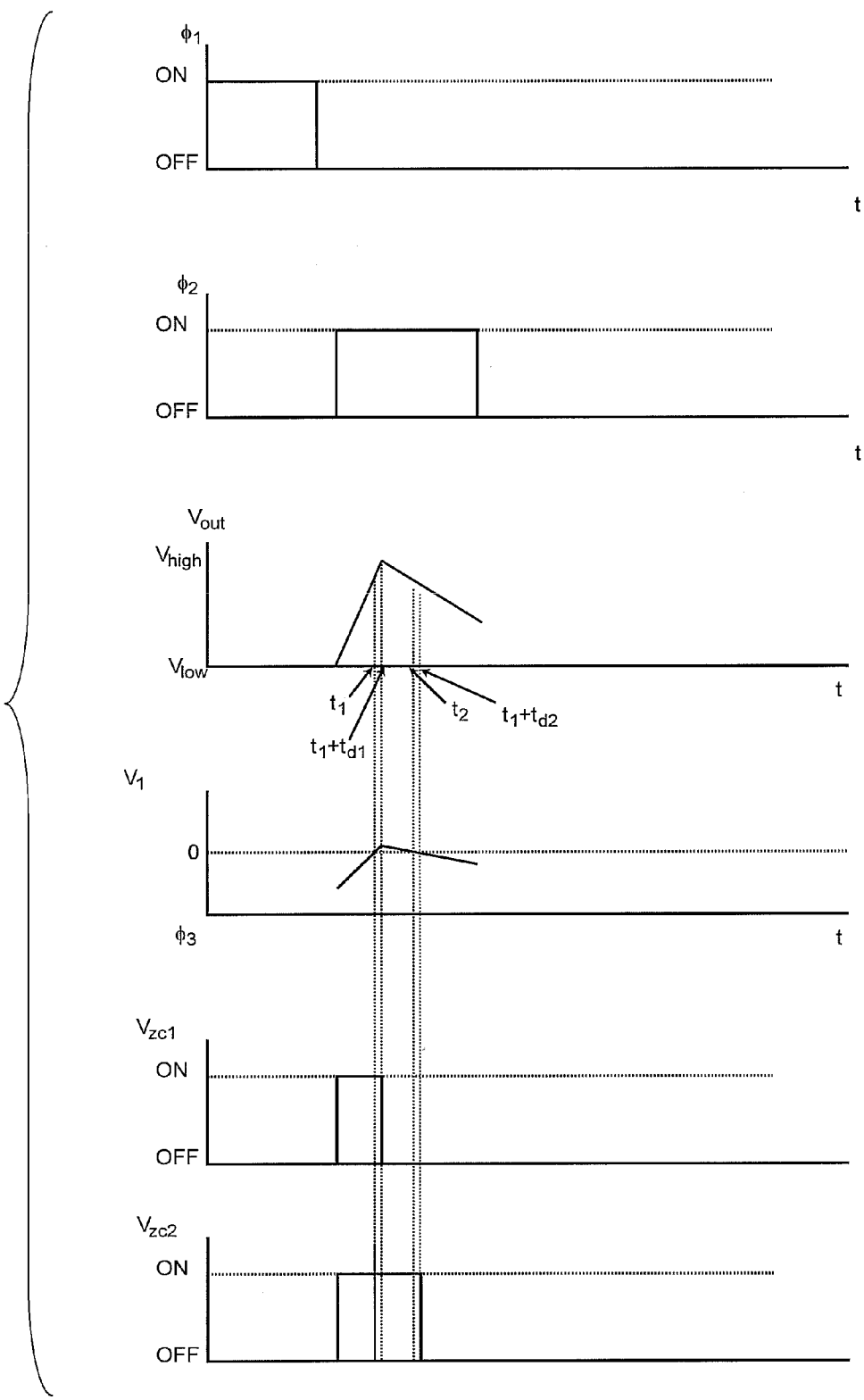
FIG. 8 illustrates a timing diagram for the non-inverting integrator of FIG. 7.

One clock cycle of the timing diagram is shown in FIG. 8. At the start of $\phi_2$, the waveform generator 20 produces an up ramp. The voltage $v_1$ is shown to cross zero at time $t_1$. One output, $v_{zc1}$, of the zero crossing detector 30 changes its state after a finite delay $t_{d1}$.

The delay $t_{d1}$ represents finite delay of a typical zero crossing detector 30. This change of state advances the waveform to the next segment.

Due to the $t_{d1}$ of the zero crossing detector 30, the voltage $v_1$ overshoots by a small amount above ground. The second segment of the waveform generator is a down ramp to permit another zero crossing at time $t_2$. After a second delay $t_{d2}$, the output $v_{zc2}$ of the zero crossing detector 30 goes low, causing the switch $S_{23}$ to turn OFF, locking the sample of the output voltage $v_{out}$.

The delay $t_{d2}$ of the second zero crossing is not necessarily the same as the delay associated with the first zero crossing $t_{d1}$. The delay $t_{d2}$ contributes a small overshoot to the sampled output voltage. The effect of the overshoot can be shown to be constant offset in the sampled charge. In most sampled-data circuits, such constant offset is of little issue.

The zero crossing detector 30 preferably becomes more accurate in detecting the zero crossing as the segments of the waveform advances. The first detection being a coarse detection, it doesn't have to be very accurate. Therefore, the detection can be made faster with less accuracy. The last zero crossing detection in a given cycle determines the accuracy of the output voltage. For this reason, the last zero crossing detection must be the most accurate.

The accuracy, speed, and the power consumption can be appropriately traded among progressive zero crossing detections for the optimum overall performance. For example, the first detection is made less accurately and noisier but is made faster (shorter delay) and lower power. The last detection is made more accurately and quieter while consuming more power or being slower (longer delay).

Figure 9:
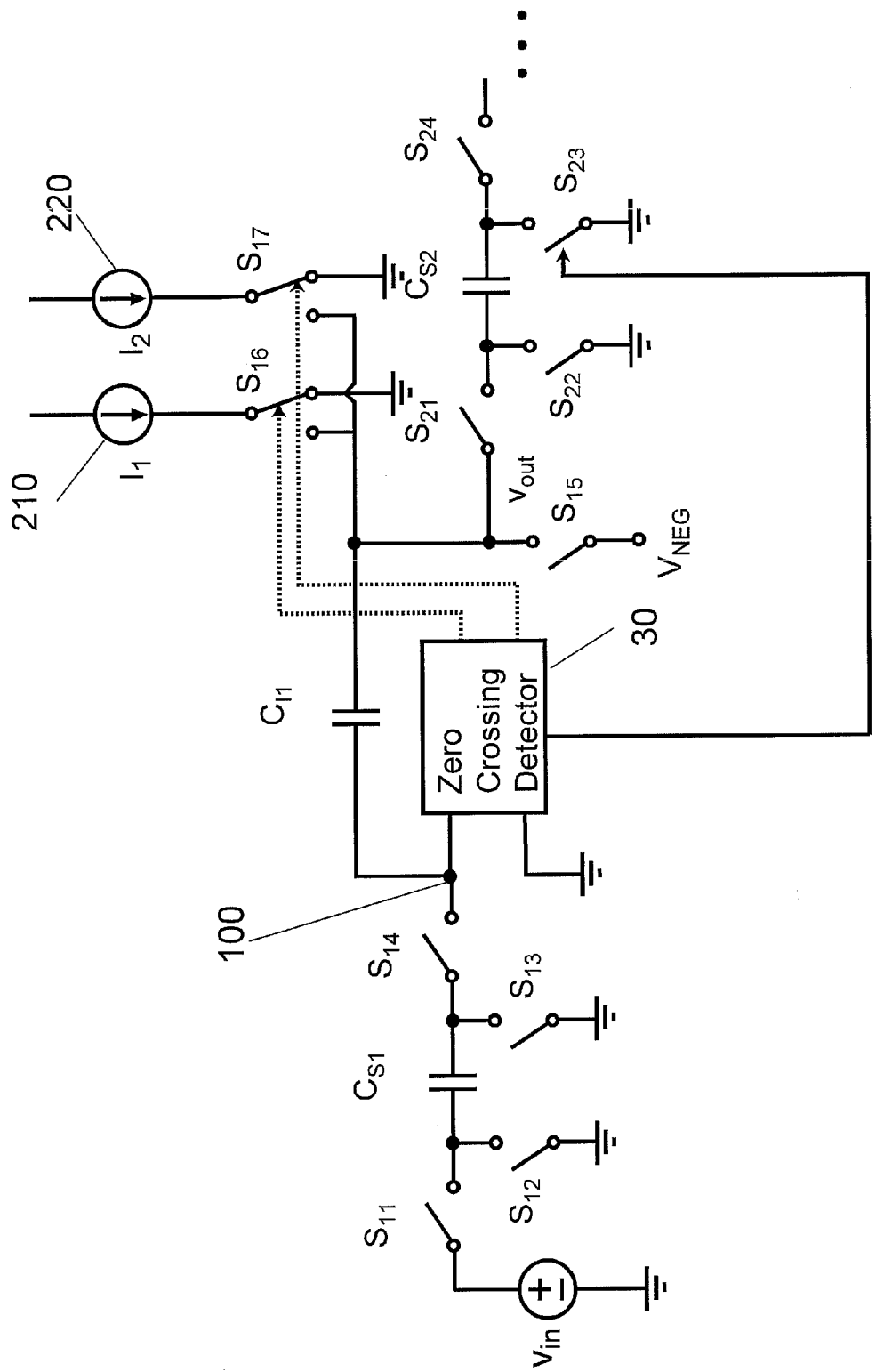
FIG. 9 illustrates another non-inverting integrator according to the concepts of the present invention.

An example of a two-segment waveform generator constructed of two current sources (210 and 220) is shown in FIG. 9. As illustrated in FIG. 9, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A zero crossing detector 30 is used to detect the point of time at which Node 100 crosses ground. The switch $S_{23}$ is controlled by the output of the zero crossing detector 30. The output of the zero crossing detector 30 is used to determine the time point to take the sample of the output voltage $v_{out}$.

Current sources 210 and 220 charge the capacitors $C_{S2}$ and the series connected $C_{S1}$ and $C_{I1}$ generating two segments of a ramp waveform. At the start of $\phi_2$, the output is briefly shorted to a known voltage $V_{NEG}$, the value of which is chosen to ensure the voltage $v_1$ crosses zero with signals in the normal operating range. During the first segment, the current source 210 is directed to the output, while during the second segment, the current source 220 is directed to the output, generating two different slopes of ramp.

Figure 10:
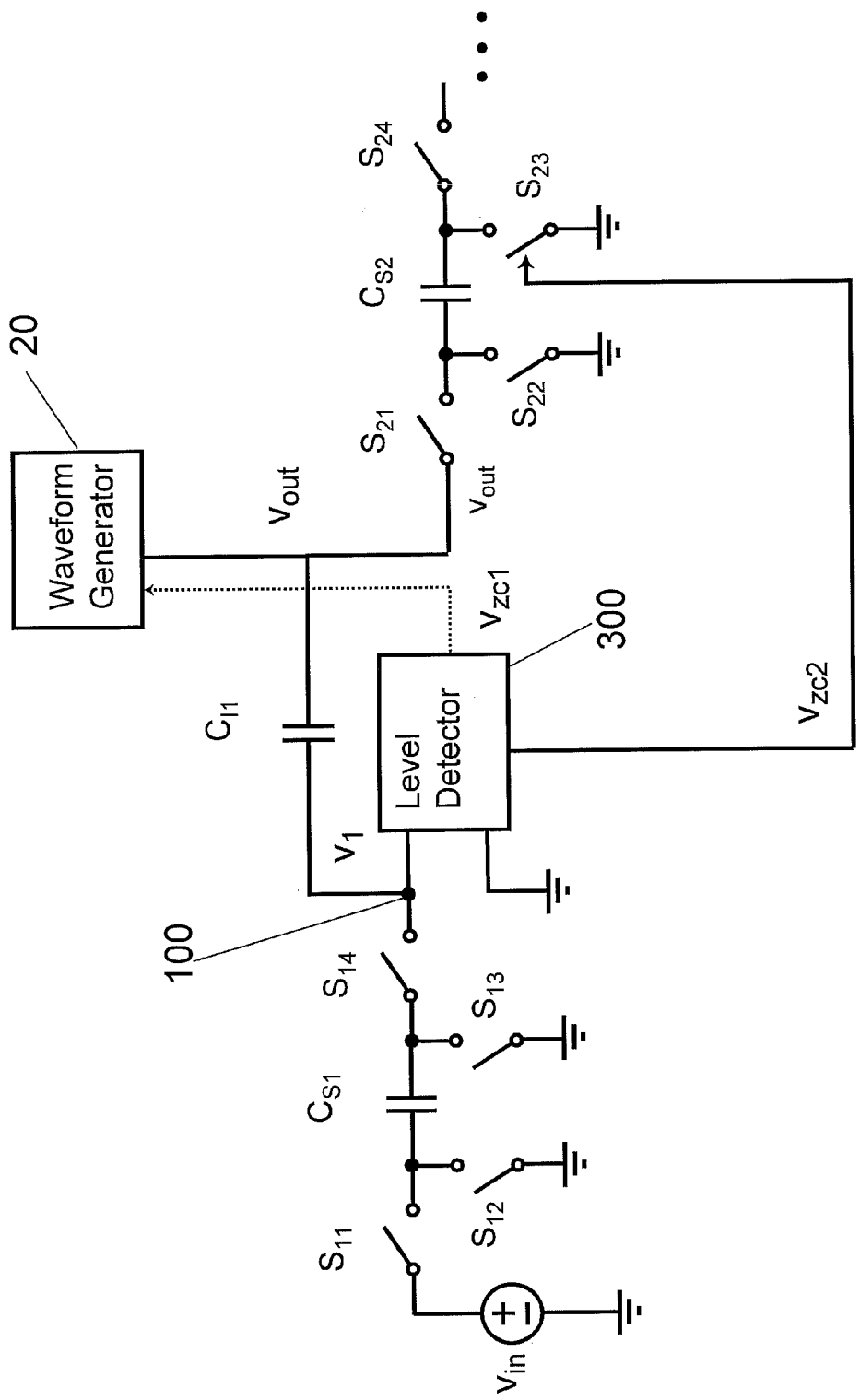
FIG. 10 illustrates another non-inverting integrator according to the concepts of the present invention.

As illustrated in FIG. 10, the non-inverting integrator includes a level crossing detector 300 having plurality of thresholds. As illustrated in FIG. 10, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. A level crossing detector 300 is used to detect the point of time at which Node 100 crosses one of plurality of predetermined levels as discussed below. The switch $S_{23}$ is controlled by the output of the level crossing detector 300. The output of the level crossing detector 300 is used to determine the time point to take the sample of the output voltage $v_{out}$.

The thresholds are predetermined voltage levels. The thresholds of the level crossing detector 300 can be adjusted to minimize overshoot.

Figure 11:
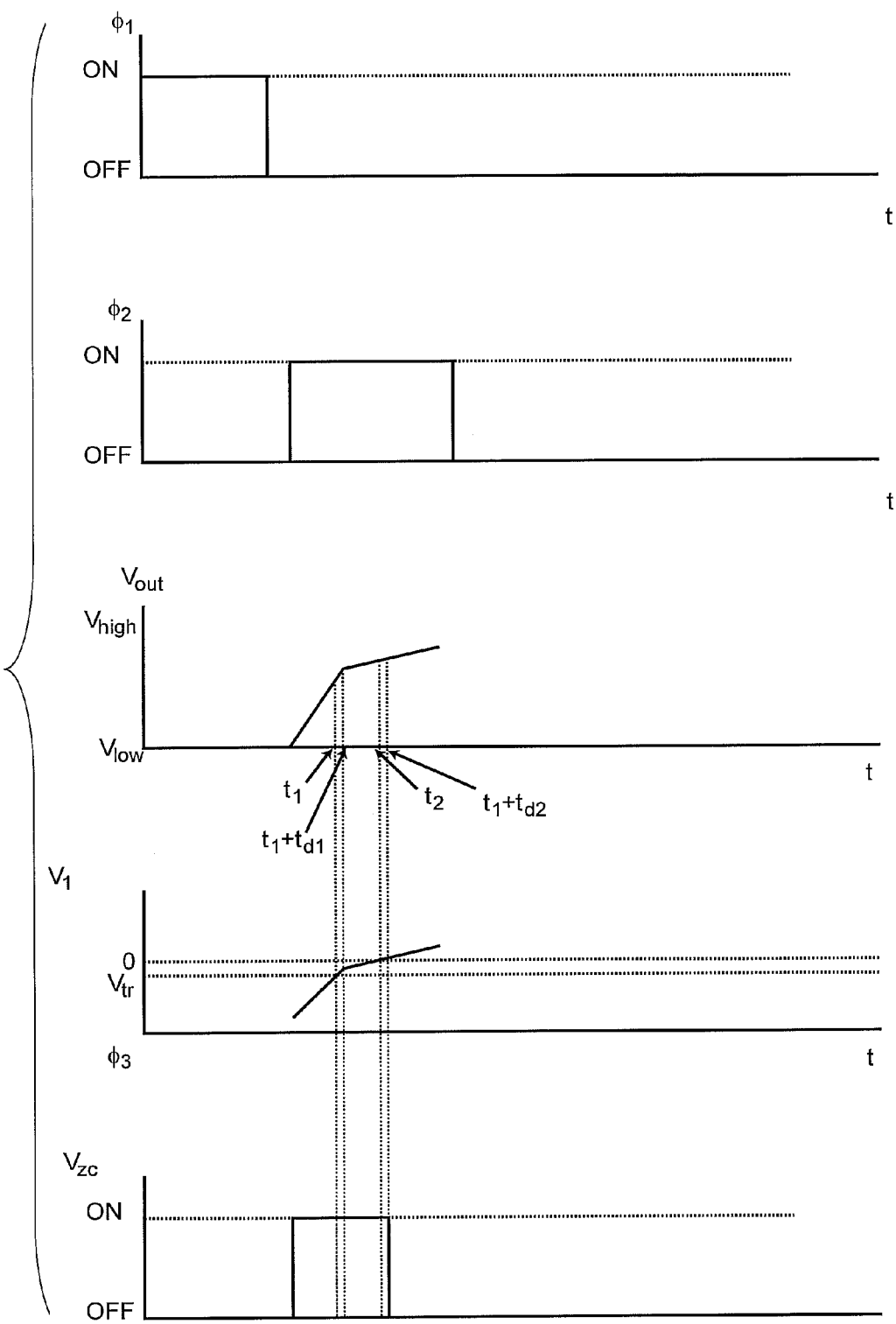
FIG. 11 illustrates a timing diagram for the non-inverting integrator of FIG. 10.

For example, the threshold for the first detection may be made negative by a slightly smaller amount than the expected overshoot in the first segment. This minimizes the ramp-down time in the second segment. Also, the threshold for the second segment may be made more positive by the amount of the overshoot in the second segment in order to cancel the effect of the overshoot. Alternatively, the threshold for the first segment may be made more negative than the expected overshoot during the first segment. This permits the second segment to be a positive ramp rather than a negative ramp as shown in FIG. 11.

It is advantageous to make the detection during the last segment to be the most accurate detection. The accuracy of the detection during the last segment is made higher than during other segments. This can be achieved by making the delay longer or making the power consumption higher during the last segment.

Figure 12:
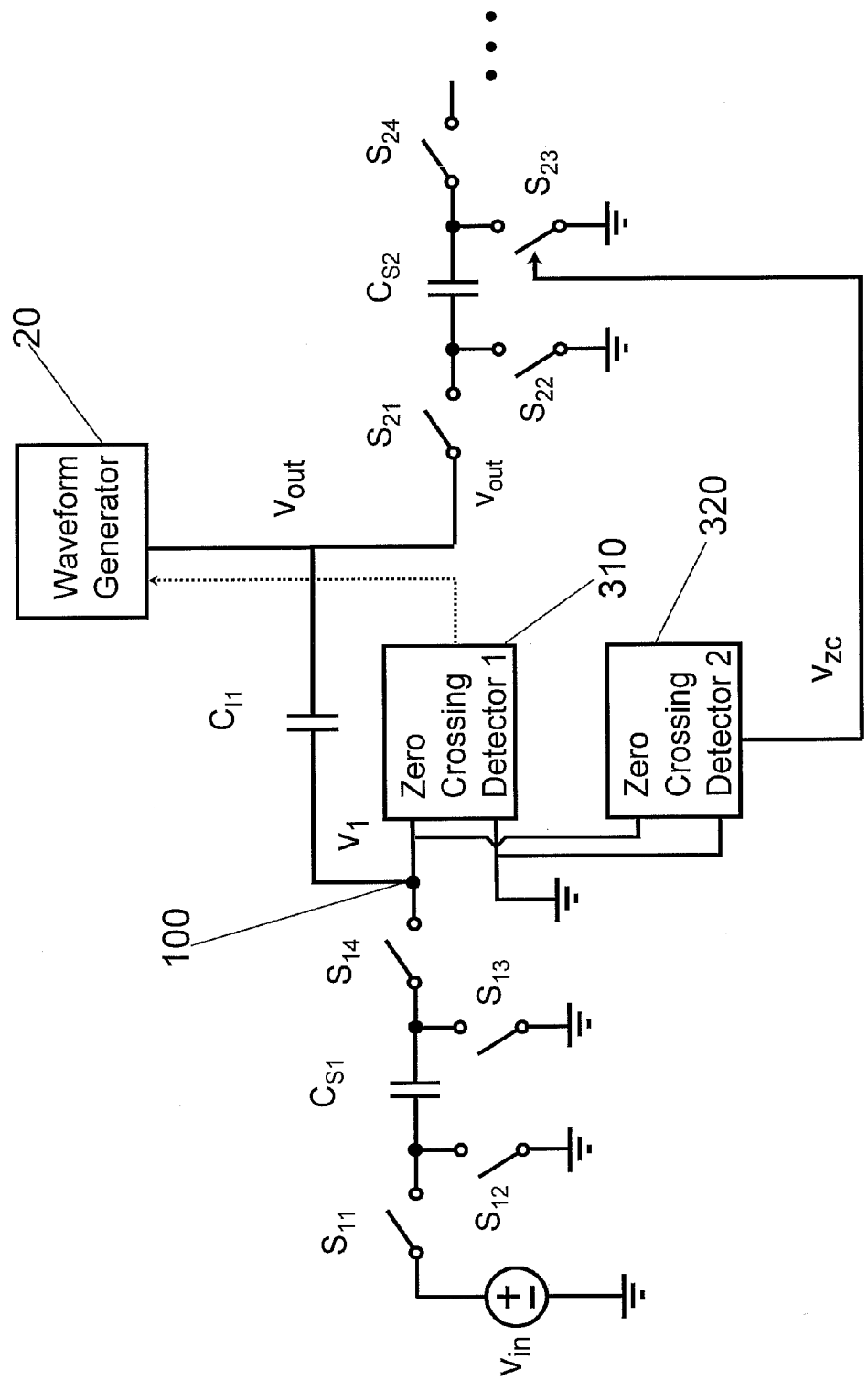
FIG. 12 illustrates another non-inverting integrator according to the concepts of the present invention.

As illustrated in FIG. 12, the non-inverting integrator includes a level crossing detector having two zero-crossing detectors, Zero Crossing Detector 1 (310) and Zero Crossing Detector 2 (320). As illustrated in FIG. 12, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. Zero Crossing Detector 1 (310) and Zero Crossing Detector 2 (320) are used to detect the point of time at which Node 100 crosses one of plurality of predetermined levels as discussed below. The switch $S_{23}$ is controlled by the output of the Zero Crossing Detector 2 (320). The output of the Zero Crossing Detector 2 (320) is used to determine the time point to take the sample of the output voltage $v_{out}$.

The thresholds of the Zero Crossing Detector 1 (310) and Zero Crossing Detector 2 (320) are selected to minimize overshoot. For example, the threshold for Zero Crossing Detector 1 (310) may be made negative by a slightly smaller amount than the expected overshoot in the first segment. This minimizes the ramp-down time in the second segment. Also, the threshold for Zero Crossing Detector 2 (320) may be made more positive by the amount of the overshoot in the second segment in order to cancel the effect of the overshoot. Alternatively, the threshold for Zero Crossing Detector 1 (310) may be made more negative than the expected overshoot during the first segment. This permits Zero Crossing Detector 2 (320) to be a positive ramp rather than a negative ramp.

In other words, Zero Crossing Detector 1 (310) makes a coarse detection, whereas Zero Crossing Detector 2 (320) makes a fine detection. Thus, it is advantageous to make Zero Crossing Detector 2 (320) to have a higher accuracy.

Figure 13:
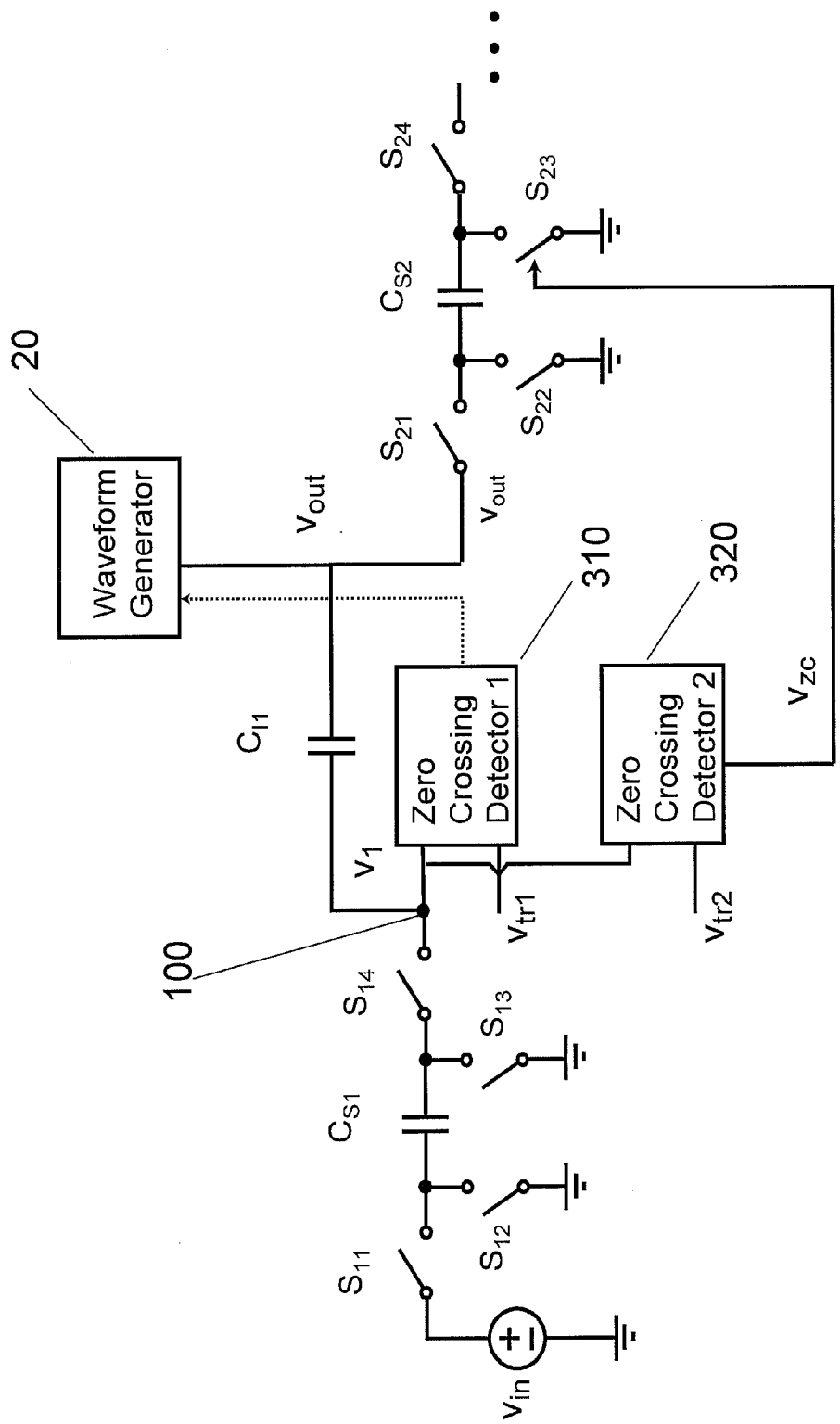
FIG. 13 illustrates another non-inverting integrator according to the concepts of the present invention.

As illustrated in FIG. 13, the non-inverting integrator includes a level crossing detector having two zero-crossing detectors, Zero Crossing Detector 1 (310) and Zero Crossing Detector 2 (320). As illustrated in FIG. 13, a clock phase $\phi_1$ is applied to switches $S_{11}$, $S_{13}$, $S_{22}$, and $S_{24}$, and another phase $\phi_2$ is applied to switches $S_{12}$, $S_{14}$, and $S_{21}$. Zero Crossing Detector 1 (310) and Zero Crossing Detector 2 (320) are used to detect the point of time at which Node 100 crosses one of plurality of predetermined levels as discussed below. The switch $S_{23}$ is controlled by the output of the Zero Crossing Detector 2 (320). The output of the Zero Crossing Detector 2 (320) is used to determine the time point to take the sample of the output voltage $v_{out}$.

Both detectors, Zero Crossing Detector 1 (310) and Zero Crossing Detector 2 (320), have nominally zero thresholds. The detection thresholds are determined by voltages $V_{tr1}$ and $V_{tr2}$ applied to the inputs of Zero Crossing Detector 1 (310) and Zero Crossing Detector 2 (320), respectively. Zero Crossing Detector 1 (310) makes a coarse detection, whereas Zero Crossing Detector 2 (320) makes a fine detection. Thus, it is advantageous to make Zero Crossing Detector 2 (320) to have a higher accuracy.

Figure 14:
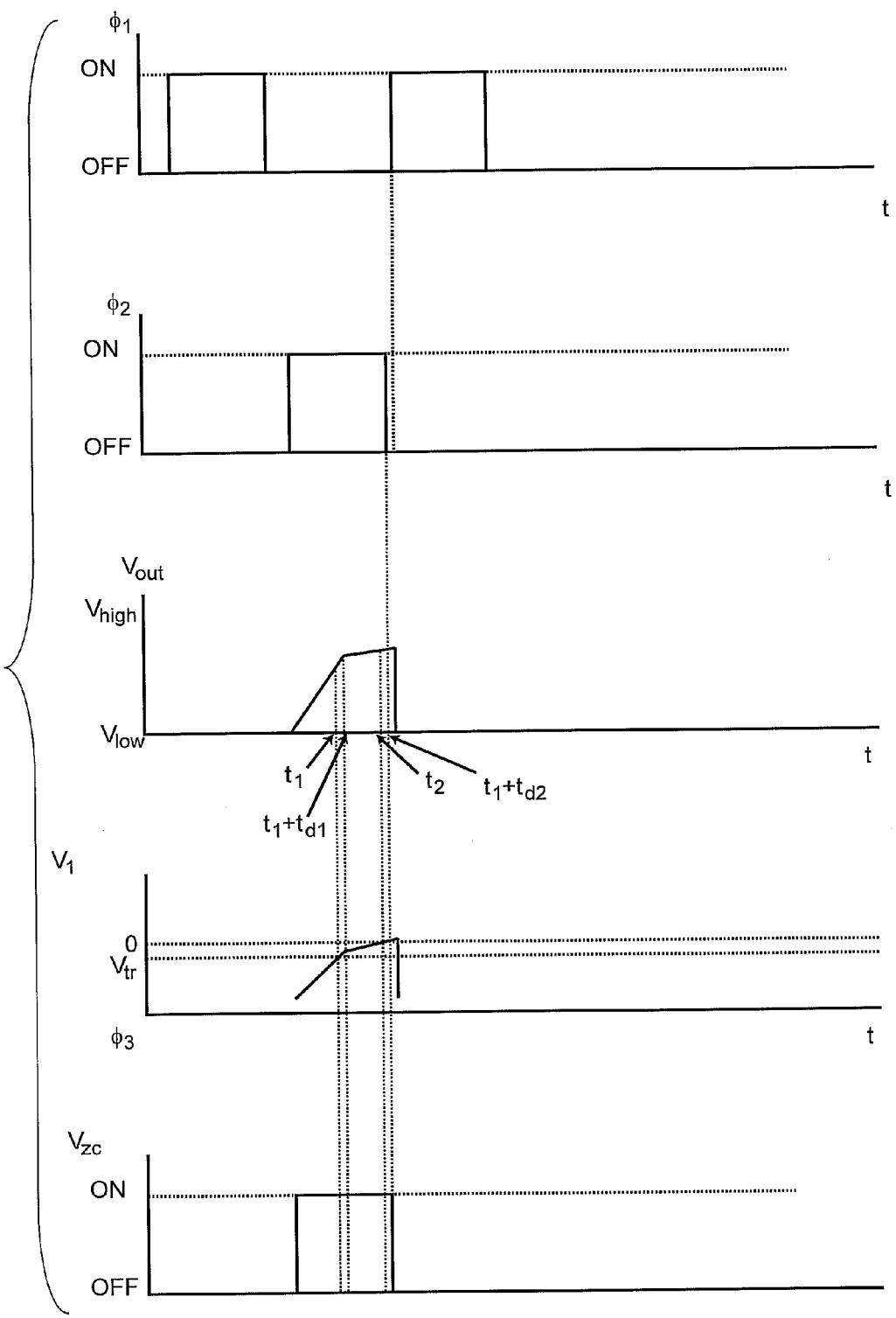
FIG. 14 illustrates a timing diagram for the non-inverting integrator of FIG. 13.

It is noted that the above-described embodiment may operate as a self-timed system. In this configuration, Rather than supplying constant frequency clock phases $\phi_1$ and $\phi_2$, the clock phases are derived from the outputs of Zero Crossing Detector 1 (310) and Zero Crossing Detector 2 (320). FIG. 14 illustrates a self-timed operation.

As illustrated in FIG. 14, the end of the phase $\phi_2$ is defined by the output of the detection during the last segment. The beginning of the clock phase $\phi_1$ is defined by a short delay, such as logic delays, after the end of $\phi_2$. The short delay is generally necessary to ensure non-overlapping clock phases. The end of the clock phase $\phi_1$ is determined by the zero crossing detection of the previous stage or the following stage in the similar manner.

It is noted that the various embodiments described above can be utilized in a pipeline analog-to-digital converter, an algorithmic analog-to-digital converter, a switched-capacitor amplifier, a delta-sigma modulator, or a self-timed algorithmic analog-to-digital converter.

It is further noted that the various embodiments described above have signal paths that are single-ended, thus, it is desirable to provide differential signal paths. The various embodiments described below provide differential signal paths.

Figure 15:
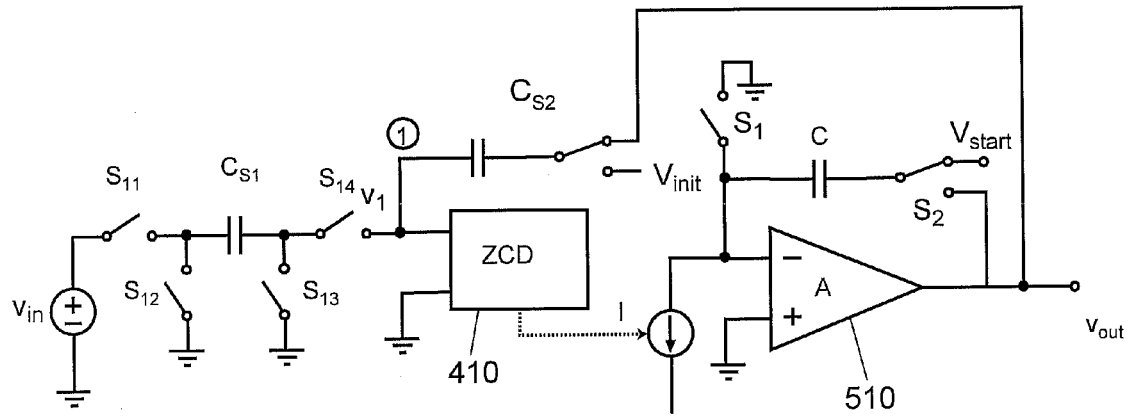
FIG. 15 illustrates a waveform generator with an output hold function according to the concepts of the present invention.

As illustrated in FIG. 15, a waveform generator with an output hold function includes an amplifier 510, a capacitor C, and a variable current source I. At the start of the transfer phase, the capacitor C is precharged by closing switch $S_1$ and connecting switch $S_2$ to voltage $V_{start}$. Then, switch $S_1$ is opened, and switch $S_2$ is connected to voltage $V_{out}$. The current I flows into the capacitor C.

It is noted that the output voltage $V_{out}$ is the integral of the current I. Thus, by varying the current waveform I as a function of time, the output waveform voltage $V_{out}$ can be varied to produce, for example, a piecewise linear waveform shown as illustrated in FIG. 8.

At the end of the transfer phase, zero-crossing detector ZCD detects the zero crossing of the voltage $V_1$ and turns OFF the current source I. When the current I is OFF, voltage $V_{out}$ remains constant, because the amplifier 510 and the capacitor C function as a hold circuit.

In this embodiment, a circuit, including zero crossing detector ZCD and capacitors ($C_{S1}$ and $C_{S2}$), functions as an amplifier or an integrator. The same output hold circuit can be used with any other function that zero-crossing detector based circuits implement; e.g., digital to analog converters.

Figure 16:
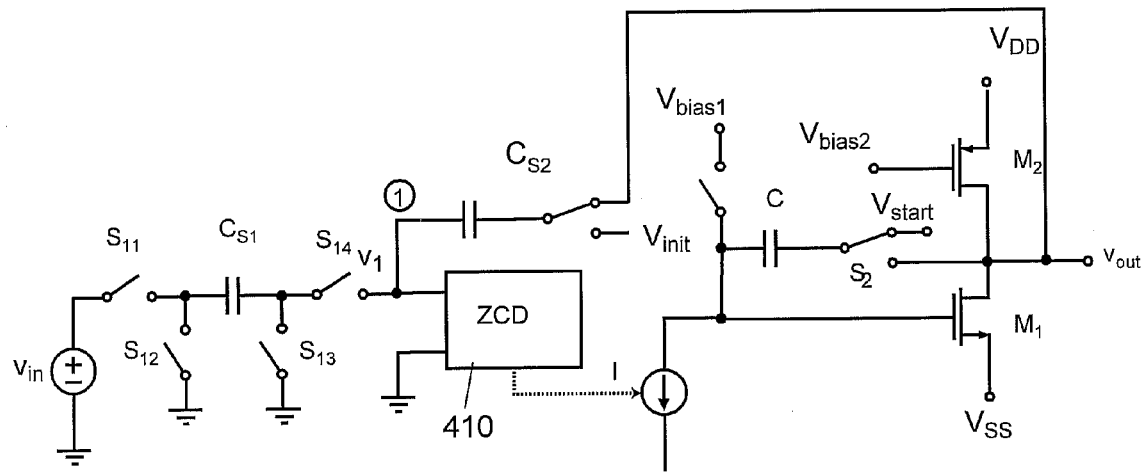
FIG. 16 illustrates another waveform generator with an output hold function according to the concepts of the present invention.

As illustrated in FIG. 16, a waveform generator with an output hold function includes common-source device $M_1$, an active load $M_2$, a capacitor C, and a variable current source I. At the start of the transfer phase, the capacitor C is precharged by closing switch $S_1$ and connecting switch $S_2$ to voltage $V_{start}$. Then, switch $S_1$ is opened, and switch $S_2$ is connected to voltage $V_{out}$. The current I flows into the capacitor C.

It is noted that the output voltage $V_{out}$ is the integral of the current I. Thus, by varying the current waveform I as a function of time, the output waveform voltage $V_{out}$ can be varied to produce, for example, a piecewise linear waveform shown as illustrated in FIG. 8.

At the end of the transfer phase, zero-crossing detector ZCD detects the zero crossing of the voltage $V_1$ and turns OFF the current source I. When the current I is OFF, voltage $V_{out}$ remains constant, because the common-source device $M_1$, an active load $M_2$, and the capacitor C function as a hold circuit.

Figure 17:
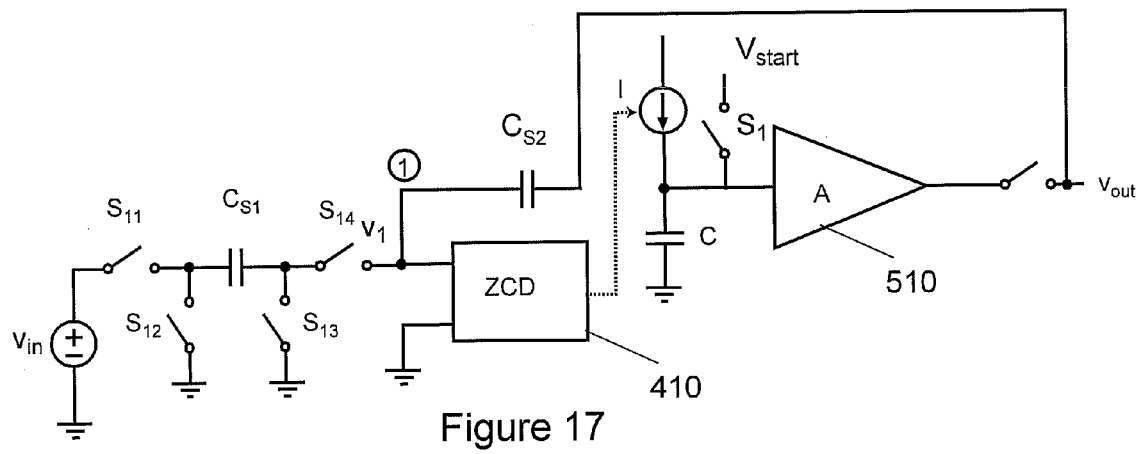
FIGS. 17 and 18 illustrate waveform generators according to the concepts of the present invention.
Figure 18:
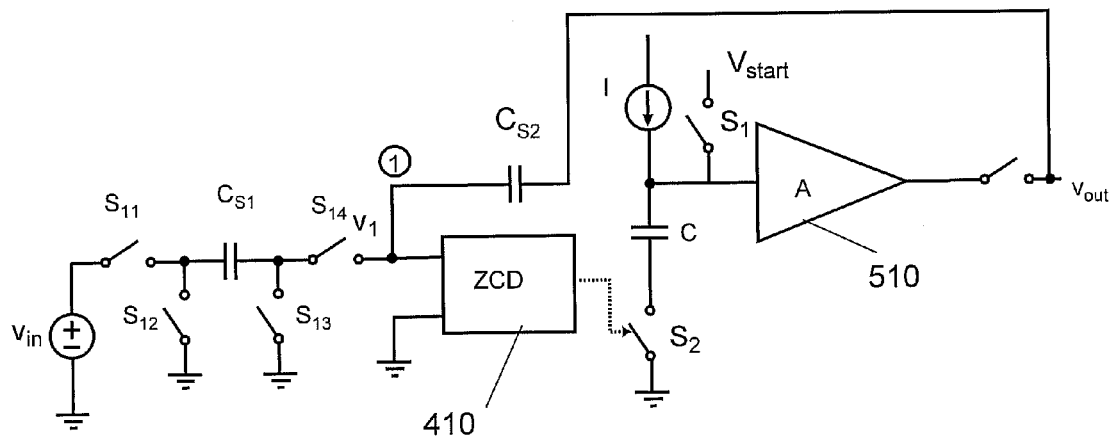

In another embodiment, as illustrated in FIG. 17, a waveform generator includes of an amplifier 510, a capacitor C, and a variable current source I. At the start of the transfer phase, the capacitor C is precharged by closing switch $S_1$. Then, switch $S_1$ is opened. The current I flows into the capacitor C. By varying the current waveform I as a function of time, the output waveform voltage $V_{out}$ can be varied to produce, for example, a piecewise linear waveform, as illustrated in FIG. 8.

At the end of the transfer phase, zero-crossing detector ZCD detects the zero crossing of the voltage $V_1$ and turns OFF the current source I. When the current I is OFF, voltage $V_{out}$ remains constant because the amplifier 510 and the capacitor C function as a hold circuit. As with the embodiment of FIG. 15, the output hold circuit can be used with any other function that zero-crossing detector based circuits implement; e.g., digital to analog converters.

In another embodiment, as illustrated in FIG. 17, a waveform generator includes of an amplifier 510, a capacitor C, and a variable current source I. At the start of the transfer phase, the capacitor C is precharged by closing switches $S_1$ and $S_2$. Then, switch $S_1$ is opened. The current I flows into the capacitor C. By varying the current waveform I as a function of time, the output waveform voltage $V_{out}$ can be varied to produce, for example, a piecewise linear waveform, as illustrated in FIG. 8.

At the end of the transfer phase, zero-crossing detector ZCD detects the zero crossing of the voltage $V_1$ and turns OFF switch $S_2$. The current source I is then turned OFF, and switch $S_2$ is turned ON again.

It is noted that the output voltage $v_{out}$ is sampled at the moment switch $S_2$ is turned OFF and held constant when switch $S_2$ is ON.

As with the embodiment of FIG. 15, the output hold circuit can be used with any other function that zero-crossing detector based circuits implement; e.g., digital to analog converters.

Figure 19:
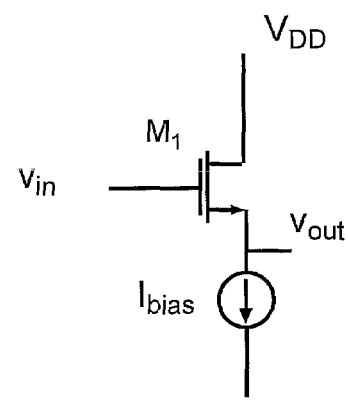
FIG. 19 illustrates an amplifier according to the concepts of the present invention.

FIG. 19 shows one design of an amplifier that can be utilized in the various embodiments described above. As illustrated in FIG. 19, the amplifier includes a source-follower transistor $M_1$ and a current source $I_{bias}$, preferably implemented with a MOS transistor.

Figure 20:
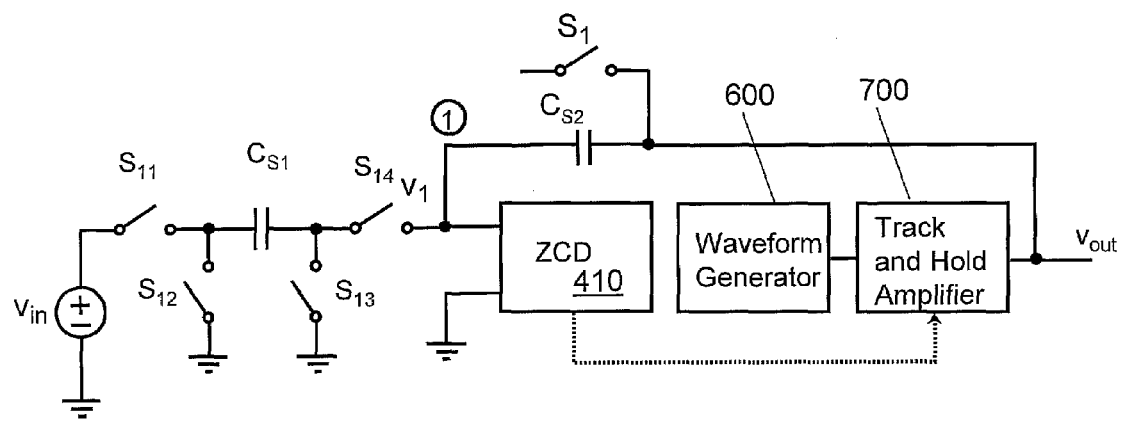
FIG. 20 illustrates a track and hold amplifier according to the concepts of the present invention.

FIG. 20 illustrates a waveform generator 600 with an output track and hold amplifier 700. The mode of the track and hold amplifier 700 is controlled by zero-crossing detector ZCD. The track and hold amplifier 700 goes into the hold mode when the zero crossing of $V_1$ is detected by zero-crossing detector ZCD at the end of the transfer phase.

While various examples and embodiments of the present invention have been shown and described, it will be appreciated by those skilled in the art that the spirit and scope of the present invention are not limited to the specific description and drawings herein, but extend to various modifications and changes.

What is claimed is:

1. A switched-capacitor circuit, comprising:
    a level-crossing detector to generate a level-crossing detection signal when an input signal crosses a predetermined level; and
    a waveform generator to generate a predetermined waveform;
    said waveform generator including,
        an amplifier operatively coupled to said level-crossing detector,
        a current source operatively coupled to said amplifier, and
        a capacitor operatively coupled to said amplifier;

said amplifier and said capacitor holding an output of said waveform generator in response to said level-crossing detection signal;

said waveform generator producing said predetermined waveform as a function of a current waveform generated by said current source.

2. The switched-capacitor circuit as claimed in claim 1, wherein said level-crossing detector is a zero-crossing detector.

3. The switched-capacitor circuit as claimed in claim 1, wherein said level-crossing detector is a comparator.

4. The switched-capacitor circuit as claimed in claim 1, wherein said current source is a variable current source.

5. The switched-capacitor circuit as claimed in claim 4, wherein said variable current source is turned OFF in response to said level-crossing detection signal.

6. The switched-capacitor circuit as claimed in claim 5, wherein said level-crossing detector is a zero-crossing detector.

7. The switched-capacitor circuit as claimed in claim 5, wherein said level-crossing detector is a comparator.

8. The switched-capacitor circuit as claimed in claim 1, wherein said waveform generator produces a piecewise linear waveform.

9. The switched-capacitor circuit as claimed in claim 1, wherein said amplifier includes a common-source device and an active load.

10. The switched-capacitor circuit as claimed in claim 1, wherein said amplifier includes a source follower device.

11. The switched-capacitor circuit as claimed in claim 1, wherein said current source is a variable current source, said waveform generator includes a switch, said switch being turned OFF in response to said level-crossing detection signal.

12. The switched-capacitor circuit as claimed in claim 11, wherein said level-crossing detector is a zero-crossing detector.

13. The switched-capacitor circuit as claimed in claim 11, wherein said level-crossing detector is a comparator.

14. A method for sampling a signal, the method comprising:

(a) sampling an input voltage using a switched capacitance network;

(b) determining when a node voltage of the switched capacitance network crosses a predetermined level;

(c) generating a predetermined waveform at an output node as a function of a current waveform generated by a current source;

(d) transferring the sampled input voltage to the output node; and (e) holding the transferred sampled input voltage at a constant level at the output node when it is determined that the node voltage of the switched capacitance network crosses the predetermined level.

15. The method as claimed in claim 14, wherein the predetermined level is a zero voltage level.

16. The method as claimed in claim 14, wherein the predetermined waveform is a piecewise linear waveform.

17. The method as claimed in claim 14, wherein the predetermined waveform remains at a constant level when it is determined that the node voltage of the switched capacitance network crosses the predetermined level.

18. The method as claimed in claim 17, wherein the predetermined level is a zero voltage level.

19. The method as claimed in claim 14, wherein the predetermined waveform is generated by a variable current source.

* * * * *